United States Patent
Chang et al.

(10) Patent No.: US 10,262,725 B1
(45) Date of Patent: Apr. 16, 2019

(54) SELECTIVE BIT-LINE SENSING METHOD AND STORAGE DEVICE UTILIZING THE SAME

(71) Applicant: National Tsing Hua University, Hsinchu (TW)

(72) Inventors: Meng-Fan Chang, Taichung (TW); Win-San Khwa, Taipei (TW); Jia-Jing Chen, Taoyuan (TW)

(73) Assignee: NATIONAL TSING HUA UNIVERSITY, Taipei (TW)

( * ) Notice: Subject to any disclaimer, the term of this patent is extended or adjusted under 35 U.S.C. 154(b) by 0 days.

(21) Appl. No.: 15/827,717

(22) Filed: Nov. 30, 2017

(51) Int. Cl.
  *G11C 11/00* (2006.01)
  *G11C 11/419* (2006.01)
  *G06N 3/04* (2006.01)

(52) U.S. Cl.
  CPC .............. *G11C 11/419* (2013.01); *G06N 3/04* (2013.01)

(58) Field of Classification Search
  CPC ................................. G11C 11/419; G06N 3/04
  USPC ....................................................... 365/154
  See application file for complete search history.

(56) References Cited

U.S. PATENT DOCUMENTS

| 5,014,235 | A  | * | 5/1991  | Morton    | G06F 5/015 365/185.11 |
| 6,693,815 | B2 | * | 2/2004  | Mattausch | G11C 15/00 365/154 |
| 9,627,040 | B1 |   | 4/2017  | Chang et al. | |
| 2012/0259804 | A1 | * | 10/2012 | Brezzo | G06N 3/049 706/25 |

* cited by examiner

*Primary Examiner* — Tha-O H Bui
(74) *Attorney, Agent, or Firm* — Muncy, Geissler, Olds & Lowe, P.C.

(57) ABSTRACT

A selective bit-line sensing method is provided. The selective bit-line sensing method includes the steps of: generating a neuron weights information, the neuron weights information defines a distribution of 0's and 1's storing in the plurality of memory cells of the memory array; and selectively determining either the plurality of bit-lines or the plurality of complementary bit-lines to be sensed in a sensing operation according to the neuron weights information. When the plurality of bit-lines are determined to be sensed, the plurality of first word-lines are activated by the artificial neural network system through the selective bit-line detection circuit, and when the plurality of complementary bit-lines are determined to be sensed, the plurality of second word-lines are activated by the artificial neural network system.

13 Claims, 11 Drawing Sheets

112

SELECTIVE BIT-LINE SENSING METHOD AND STORAGE DEVICE UTILIZING THE SAME

BACKGROUND OF THE INVENTION

Field of the Invention

The exemplary embodiment(s) of the present invention relates to a field of SRAM cell design and an operation for selective bit-line sensing scheme. More specifically, the exemplary embodiment(s) of the present invention relates to a selective bit-line sensing method and a storage device utilizing the same based on asymmetric distribution of 0's and 1's in neuron weights and the capability of sensing BL and BLB separately in SRAM cells.

Description of Related Art

In neural network applications, lots of word lines would be turned on during the inference operation, resulting in a large number of memory cells being activated simultaneously. Large total cell current will be accumulated, thus the energy consumption is significantly increased.

In SRAM, as shown in FIG. 1, which is a circuit layout showing the configuration of a conventional operation of the memory cell. As shown in the figure, the cell current $I_{CELL}$ will be generated from memory cells with Q=0, while the memory cells with Q=1 will conduct leakage current $I_{LEAK}$. The cell current $I_{CELL}$ is substantially larger than the leakage current $I_{LEAK}$, and thus the leakage current may be ignored. The accumulated current on the bit-line BL may therefore be calculated as $IBL=I_{CELL}*\Sigma(\text{cells with Q=0})$.

Furthermore, the sensing operation in the conventional SRAM may be (1) differential or (2) single-ended. In the case of differential sensing operation, both the bit-lines BL and the complementary bit-lines BLB are used for sensing. On the other hand, in single-ended sensing, either the bit-lines BL or the complementary bit-lines BLB is used for sensing. The sensing approach is fixed depending on the design.

Therefore, a new SRAM memory architecture that may utilize the traditional memory cell design, while achieve energy-saving, time-saving and area-efficient characteristics is needed.

SUMMARY OF THE INVENTION

According to an aspect of the present application, a selective bit-line sensing method is disclosed. The selective bit-line sensing method is adapted for an artificial neural network system connecting to a storage device, the storage device includes a memory array comprising a plurality of memory cells arranged in a matrix and connected to a plurality of first word-lines and a plurality of second word-lines, respectively, and columns of the matrix are connected to a plurality of bit-lines and a plurality of complementary bit-lines, respectively. The method includes the steps of: generating a neuron weights information, wherein the neuron weights information defines a distribution of 0's and 1's storing in the plurality of memory cells of the memory array by the artificial neural network system; and selectively determining either the plurality of bit-lines or the plurality of complementary bit-lines to be sensed in a sensing operation according to the neuron weights information. When the plurality of bit-lines are determined to be sensed in the sensing operation, the plurality of first word-lines are activated by the artificial neural network system through the selective bit-line detection circuit, and when the plurality of complementary bit-lines are determined to be sensed in the sensing operation, the plurality of second word-lines are activated by the artificial neural network system.

Preferably, the distribution of 0's and 1's further comprising a number of status Q=0 and a number of status QB=0 stored in the plurality of the memory cells.

Preferably, when the number of status Q=0 smaller than the number of status QB=0, the plurality of bit-lines are determined to be sensed, and when the number of status QB=0 smaller than the number of status Q=0, the plurality of complementary bit-lines are determined to be sensed.

Preferably, the method further includes: configuring a mode selection circuit to provide a bit-line sensing signal when the plurality of bit-lines is determined to be sensed, and configuring the mode selection circuit to provide a complementary bit-line sensing signal when the plurality of bit-lines is determined to be sensed.

Preferably, if the plurality of complementary bit-lines are determined to be sensed in the sensing operation, signals of a plurality of word-lines first and second word-lines are inverted by a word-line activation circuit.

Preferably, if the plurality of complementary bit-lines are determined to be sensed in the sensing operation, output signals of the plurality of complementary bit-lines are inverted by a sensing output inversion circuit.

According to another aspect of the present application, a storage device is provided. The storage device is adapted for an artificial neural network system, the artificial neural network system is configured to generate a neuron weights information defining a distribution of 0's and 1's, and to determine a number of word-lines to be activated, the storage device includes a memory array, an array control circuit and a selective bit-line sensing control circuit. The memory array includes a plurality of memory cells arranged in a matrix, a plurality of first word-lines connected to the plurality of memory cells, respectively, a plurality of second word-lines connected to the plurality of memory cells, respectively, a plurality of bit-lines connected to columns of the matrix, respectively, and a plurality of complementary bit-lines connected to the columns of the matrix, respectively. The array control circuit is coupled to the memory array. The selective bit-line sensing control circuit is connected to the array control circuit, and is configured to control the array control circuit to selective sense either the plurality of bit-lines or the plurality of complementary bit-lines in a sensing operation. The sensing of the plurality of bit-lines or the plurality of complementary bit-lines is determined according to the neuron weights information. If the plurality of bit-lines are determined to be sensed in the sensing operation, the plurality of first word-lines are activated by the artificial neural network system through the selective bit-line detection circuit, and if the plurality of complementary bit-lines are determined to be sensed in the sensing operation, the plurality of second word-lines are activated by the artificial neural network system.

Preferably, the distribution of 0's and 1's further comprising a number of status Q=0 and a number of status QB=0 stored in the plurality of the memory cells.

Preferably, when the number of status Q=0 smaller than the number of status QB=0, the plurality of bit-lines are determined to be sensed, and when the number of status QB=0 smaller than the number of status Q=0, the plurality of complementary bit-lines are determined to be sensed.

Preferably, the storage device further comprises a selective bit-line sensing detection circuit coupling to the selective bit-line sensing control circuit. The elective bit-line sensing detection circuit is configured to determine either the plurality of bit-lines or the plurality of complementary bit-lines are to be sensed in the sensing operation according to the neuron weights information.

Preferably, the storage device further comprises a word-line activation circuit connected to the plurality of first and second word-lines, the word-line activation circuit is configured to activate the plurality of first word-lines when the plurality of bit-lines are determined to be sensed in the sensing operation, and the word-line activation circuit is configured to activate the plurality of second word-lines when the plurality of complementary bit-lines are determined to be sensed in the sensing operation.

Preferably, the storage device further comprises a sensing output inversion circuit connected to an output of the plurality of bit-lines and the plurality of complementary bit-lines in each columns of the matrix, the sensing output inversion circuit is configured to invert output signals of the plurality of complementary bit-lines when the plurality of complementary bit-lines are determined to be sensed in the sensing operation.

With these and other objects, advantages, and features of the invention that may become hereinafter apparent, the nature of the invention may be more clearly understood by reference to the detailed description of the invention, the embodiments and to the several drawings herein.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PREFERRED EMBODIMENTS

Exemplary embodiments of the present invention are described herein in the context of a transpose reading memory device and method.

Those of ordinary skilled in the art will realize that the following detailed description of the exemplary embodiment(s) is illustrative only and is not intended to be in any way limiting. Other embodiments will readily suggest themselves to such skilled persons having the benefit of this disclosure. Reference will now be made in detail to implementations of the exemplary embodiment(s) as illustrated in the accompanying drawings. The same reference indicators will be used throughout the drawings and the following detailed description to refer to the same or like parts.

In accordance with the embodiment(s) of the present invention, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

Figure 2:
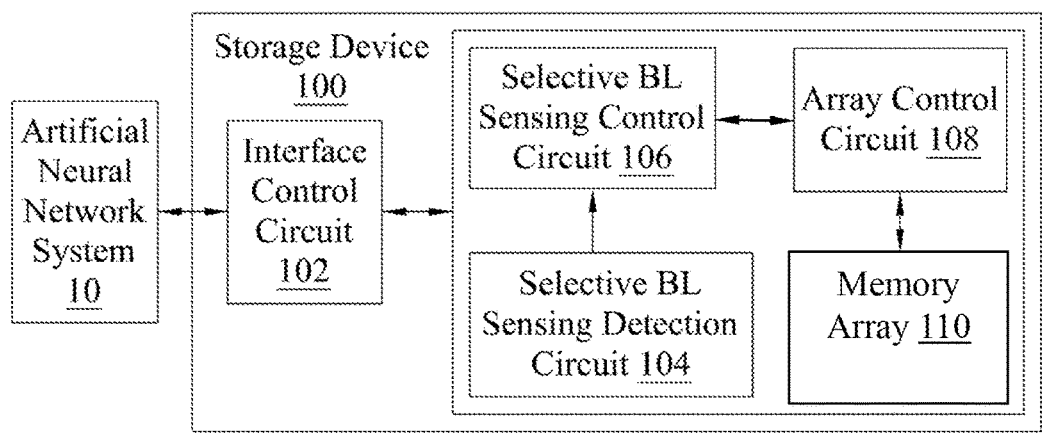
FIG. 2 is a block diagram showing a configuration of a storage device according to the embodiment of the present application.

FIG. 2 is a block diagram showing a configuration of a storage device according to the embodiment of the present application. The storage device 100 is adapted for an artificial neural network system 10 as shown in the figure. The artificial neural network system 10 provides networks which process information by modeling a network of neurons, such as neurons in a human brain, to process information (e.g., stimuli) which has been sensed in a particular environment. Similar to a human brain, neural networks typically comprise multiple neuron models to process information. The demand for improved operating characteristics of neural networks continues to increase. Such desirable neural network operating characteristics improvements are increased speed, capacity and processing power of neural networks, for example.

Before the sensing operation performed in the storage device 100, the artificial neural network system 10 is configured to generate neuron weights information defining a distribution of 0's and 1's. Embodiments disclosed herein are directed to the use of the storage device 100, such as the SRAM cells in a commercially available memory device, in this case, the memory array 110 may be an SRAM cell array, but not limited thereto. The neuron weights information include the weights of the connections for a neural network, which may be implemented as a table stored elsewhere in the nonvolatile memory device of the artificial neural network system 10, e.g., in the memory array 110 of the storage device 110. The neuron weights information indicates the connections to the memory cells and provides the weights of the connections. When multilevel memory cells are used, the mapping between connections and memory cells can be one-to-one related.

Figure 1:
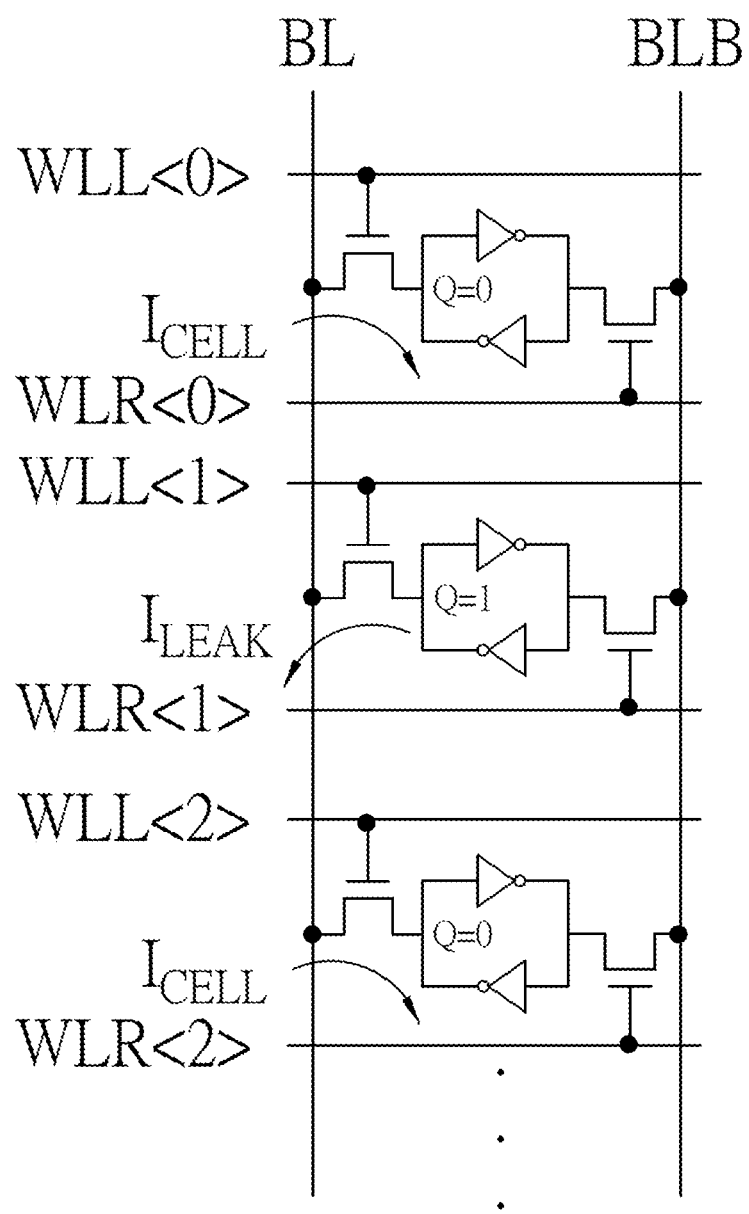
FIG. 1 is a circuit layout showing the configuration of a conventional operation of the memory cell.

Here, note that an asymmetric distribution of 0's and 1's in neuron weights are discovered in the neural network simulation. It can be seen in the FIG. 1, in the asymmetric distribution scenario in which two cells are storing Q=0 and one cell is storing Q=1. Since the difference of magnitude between the cell current $I_{CELL}$ and the leakage current $I_{LEAK}$, one sensing approach will be more energy-efficient than the other. In order to reduce the accumulated current generated in the sensing operation, for example, the 6T-SRAM cell having the capability of sensing the bit-lines BL and the complementary bit-lines BLB separately is utilized in the present embodiments. That is, the memory cells in the memory array may be read either by the bit-lines BL or the complementary bit-lines BLB. Reference is made to the U.S. patent application (Application No. 14/944,244, now U.S. Pat. No. 9,627,040) of the Applicant, the disclosure of which is incorporated herein in its entirety for reference.

The storage device 100 of FIG. 2 includes a memory array 110, an array control circuit 108, a selective bit-line sensing control circuit 106 and an interface control circuit 102. The interface control circuit 102 in the memory device 100 provides an interface between the artificial neural network system 10 and the memory cell array 110. The array control circuit 108 controls reading from and writing to the memory cell array 110. The array control circuit 108 of the storage device 100 receives commands from the selective bit-line sensing control circuit 106 and generates the electrical signals to implement reading from and writing to the memory cell array 110. Additionally, the array control circuit 108 may encode, decode and apply error detection and/or correction to the neuron weights information passed between the artificial neural network system 10 and the memory cell array 110. The selective bit-line sensing control circuit 106 is coupled to the array control circuit 108, and configured to control the array control circuit 108 to selectively sense either the plurality of bit-lines or the plurality of complementary bit-lines of the memory array 110 in a sensing operation. The selective bit-line sensing control circuit 106 may receive instructions or electrical signals representing the selection of the plurality of bit-lines or the plurality of complementary bit-lines, and translate such received instructions or electrical signals to a format that the array control circuit 108 may recognize. Such instructions or electrical signals, which will be explained later, may be transmitted from an external source outside the storage device 110, for example, the artificial neural network system 10, or from an internal functional block or circuit inside the storage device 110, for example, the selective bit-line sensing detection circuit 104. In addition, the selective bit-line sensing control circuit 106 may be integrated with the array control circuit 108, but not limited thereto.

Figure 3A:
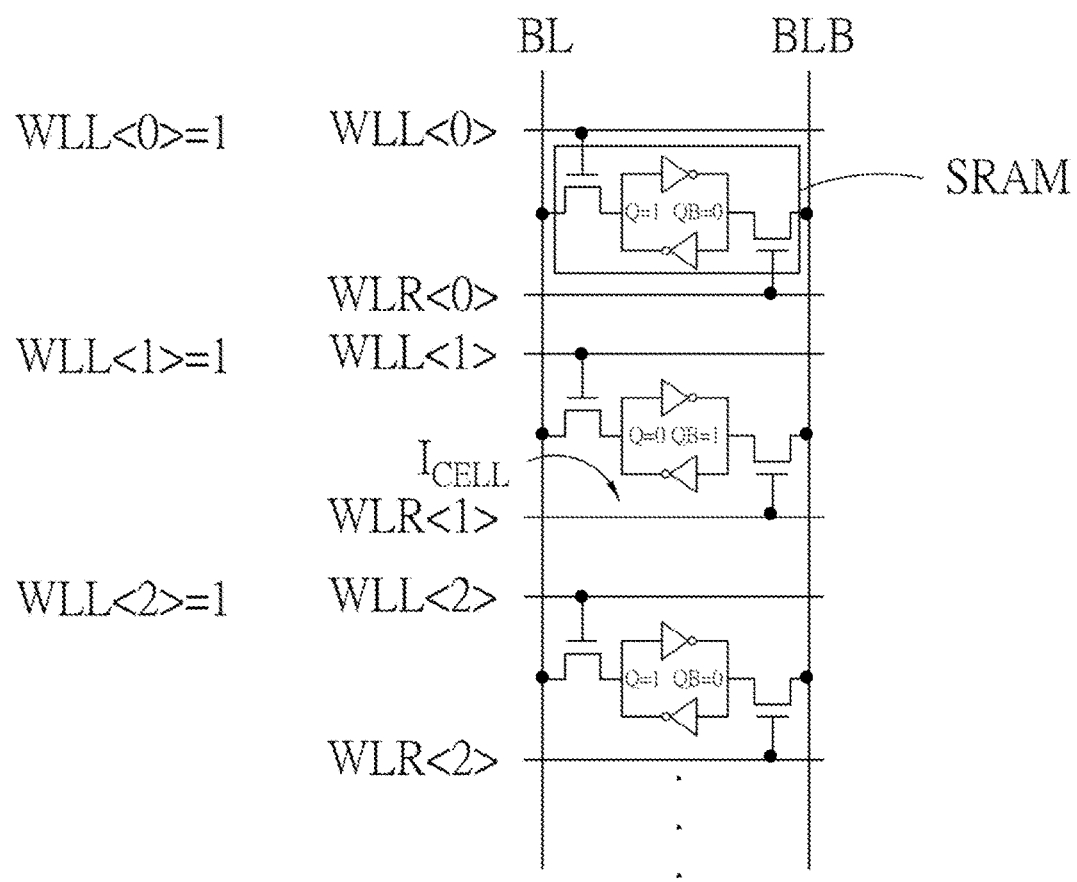
FIG. 3A is a diagram showing a sensing operation for the storage device according to the first embodiment of the present application.

Please refer to FIG. 3A, which is a diagram showing a sensing operation for the storage device according to the first embodiment of the present application. The SRAM cell array includes a plurality of memory cells SRAM arranged in a matrix, a plurality of first word-lines WLL respectively connected to the plurality of memory cells SRAM, a plurality of second word-lines WLR respectively connected to the plurality of memory cells SRAM, a plurality of bit-lines BL respectively connected to columns of the matrix, and a plurality of complementary bit-lines BLB respectively connected to the columns of the matrix. The activation of the first word-lines WLL allows sensing of the memory cells SRAM via the bit-lines BL, and similarly, activation of the second word-lines WLR allows sensing of the memory cells SRAM via the complementary bit-lines BLB. The first word-line WLL<0> represents the first word-line WLL of the first row, the second word-line WLR<0> represents the second word-line WLL of the first row.

In one exemplar embodiment, when the artificial neural network system 10 tries to access the data stored in the SRAM cell array 110, the interface control circuit 102 is configured to receive the neuron weights information for the artificial neural network system 10, and accordingly, the selective bit-line sensing detection circuit 104 may determine the sensing operation accordingly. Specifically, the selective bit-line detection circuit 104 is configured to determine whether the plurality of bit-lines BL or the plurality of complementary bit-lines BLB are to be sensed in the sensing operation according to the neuron weights information and the number of word-lines to be activated. Depending on the density of 0's and 1's in the neuron weights, either the bit-lines BL or the complementary bit-lines BLB are selected for sensing, whichever has the fewer number of 0's.

If the plurality of bit-lines BL are determined to be sensed in the sensing operation, the plurality of first word-lines WLL are activated for the artificial neural network system 10 through the selective bit-line detection circuit 104, and more specifically, through the selective bit-line sensing control circuit 106 and the array control circuit 108. On the contrary, if the plurality of complementary bit-lines BLB are determined to be sensed in the sensing operation, the plurality of second word-lines BLB is activated for the artificial neural network system 10 through the selective bit-line detection circuit 104, and more specifically, through the selective bit-line sensing control circuit 106 and the array control circuit 108.

Figure 3B:
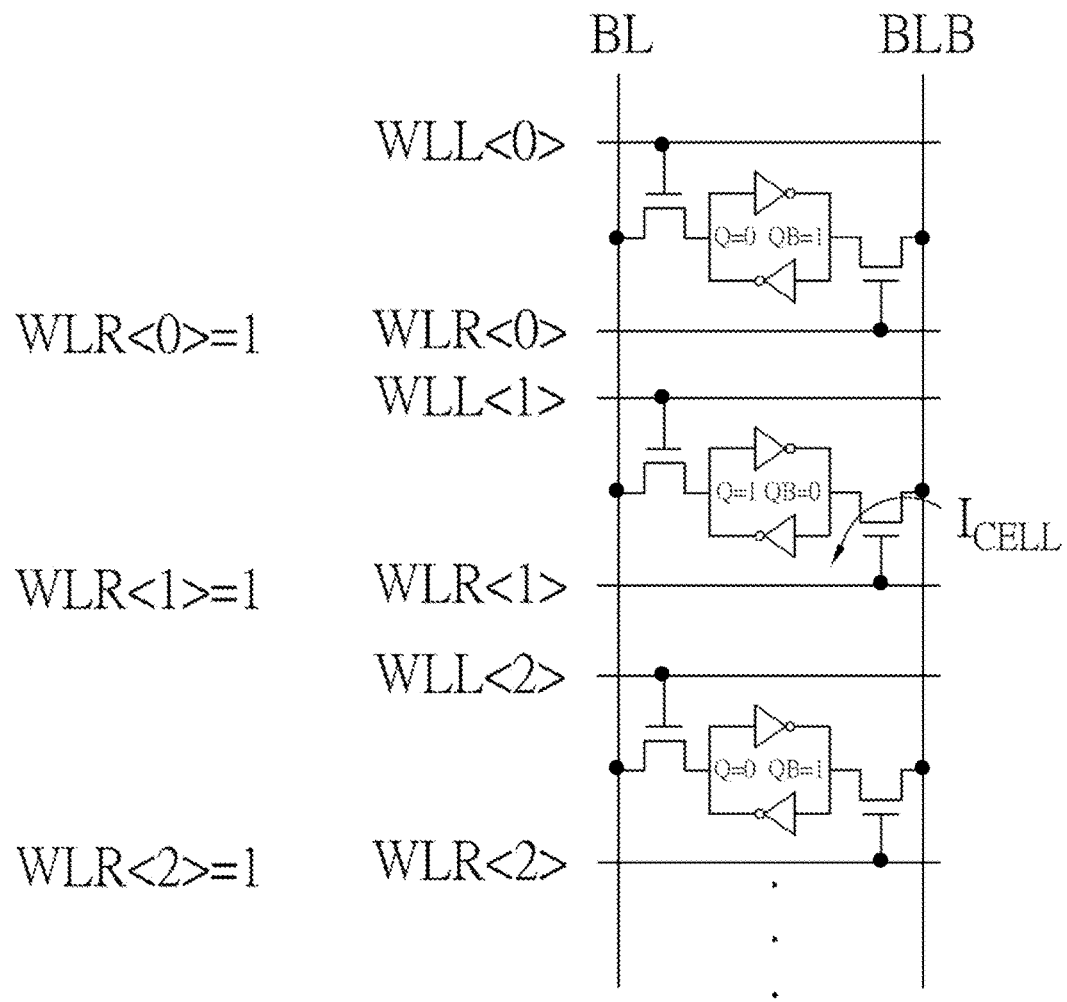
FIG. 3B is a diagram showing another sensing operation for the storage device according to the second embodiment of the present application.

The distribution of 0's and 1's may include a number of status Q=0 and a number of status QB=0 stored in the plurality of the memory cells of the memory array 110. As can be seen in the embodiments illustrated in FIGS. 3A and 3B, the number of status Q=0 (1 is found in the second SRAM cell) is smaller than the number of status QB=0 (2 are found in the first and third SRAM cells), for example, in FIG. 3A, the plurality of bit-lines BL are determined to be sensed by the selective bit-line detection circuit 104 while the first word-lines WLL<0>, WLL<1> and WLL<2> are charged to high state 1, such that the accumulated current on the bit-line $I_{BL}$ is merely $1 * I_{CELL}$ contributed by reading of the second SRAM cell. In comparison, if the memory cells are read or sensed through the complementary bit lines BLB, the accumulated current on the complementary bit-line $I_{BLB}$ would be approximately $2 * I_{CELL}$ (twice as $I_{BL}$ in this example), which is contributed by reading of the first and third SRAM cells. For another example as illustrated in FIG. 3B, the number of status QB=0 is smaller than the number of status Q=0, the plurality of complementary bit-lines BLB are determined to be sensed by the selective bit-line detection circuit 104 while the second word-lines WLR<0>, WLR<1> and WLR<2> are charged to high state 1, such that the accumulated current $I_{BLB}$ is merely $1 * I_{CELL}$. In comparison, if the memory cells are read or sensed through the bit lines BL, the accumulated current $I_{BL}$ would be approximately $2 * I_{CELL}$ (twice as $I_{BLB}$ in this example), which is contributed by reading of the first and third SRAM cells. In a very rare case that the number of Q=0 is equal to the number of status QB=0, one may choose to sense either the bit-line BL or the complementary bit-lines BLB since there would be not substantial difference of power consumption in either cases.

In an alternate embodiment, instructions from an external source may be provided to the selective bit-line sensing control circuit 106 for making the selection of sensing bit-line BL or the complementary bit-line BLB. For example, an "asymmetric-flag" transmitted from the artificial neural network system 10 may be implemented, in which when Flag=0, the first word-lines WLL may be activated and the bit lines BL would be read, and when Flag=1, the second word-lines WLR may be activated and the complementary bit lines BLB would be read. The asymmetric-flag may be decided during the training process of the artificial neural network system 10, in which the number of neurons with the weighting of 0 and the number of neurons with the weighting of 1 may be obtained during such process. Or, the asymmetric-flag may be decided by the configuration of the application, either manually or automatically. Accordingly, the bit line BL sensing or the complementary bit line BLB sensing may be decided by the asymmetric-flag.

Figure 4:
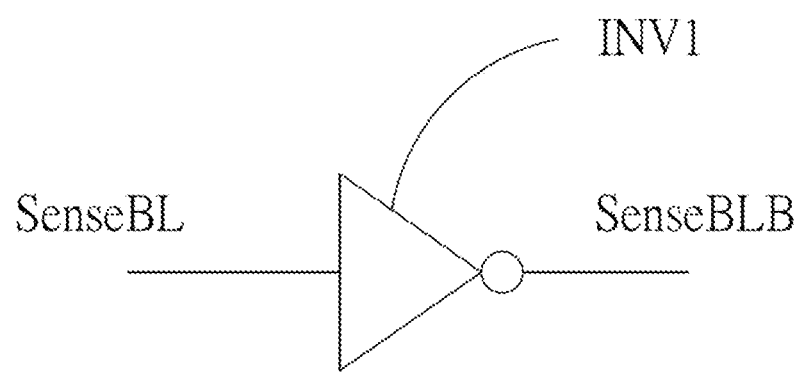
FIG. 4 is a circuit layout of the mode selection circuit according to the embodiment of the present application.

Referring to FIG. 4, which is a circuit layout of the mode selection circuit according to the embodiment of the present application. The storage device 100 of the present application may further include a mode selection circuit 112, which is connected between the selective bit-line detection circuit 104 and the plurality of the first and second word-lines WLL and WLR. The mode selection circuit 112 may be configured to provide a bit-line sensing signal SenseBL when the plurality of bit-lines BL is determined to be sensed, and to provide a complementary bit-line sensing signal SenseBLB when the plurality of complementary bit-lines BLB is determined to be sensed. In the present embodiment, the word-line activation circuit 112 may be included in the selective bit-line sensing control circuit 106 and may be implemented by a first invertor INV1 to invert the bit-line sensing signal SenseBL, such that the complementary bit-line sensing signal SenseBLB may be provided accordingly.

Figure 5:
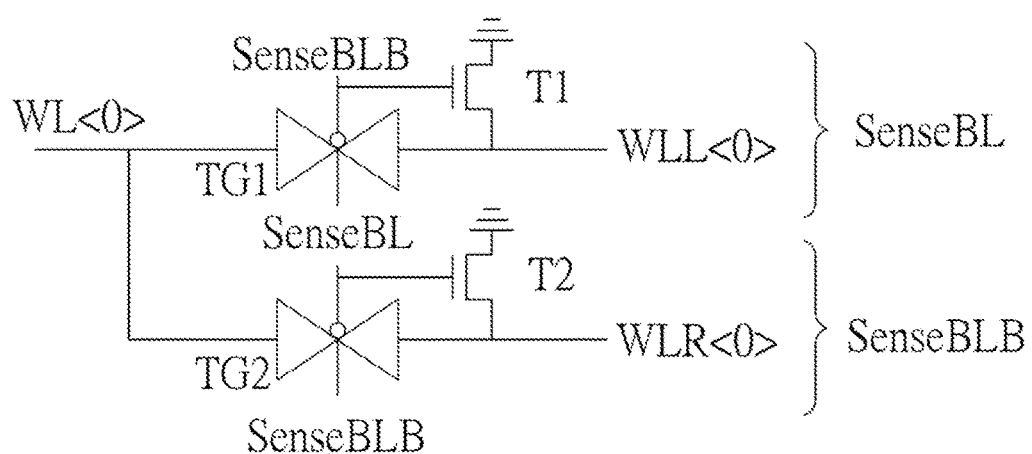
FIG. 5 is a circuit layout of the word-line activation circuit according to the embodiment of the present application.

Referring to FIG. 5, which is a circuit layout of the word-line activation circuit according to the embodiment of the present application. The storage device 100 may further include a word-line activation circuit 114 connected to the plurality of first and second word-lines WLL and WLR, if the plurality of bit-lines BL is determined to be sensed in the sensing operation, the word-line activation circuit 114 is configured to activate the plurality of first word-lines WLL, and if the plurality of complementary bit-lines BLB is determined to be sensed in the sensing operation, the word-line activation circuit 114 is configured to activate the plurality of second word-lines WLR. In the present embodiment, the word-line activation circuit 114 may be included in the selective bit-line sensing control circuit 106, and may include a first transmission gate TG1, a second transmission gate TG2, a first transistor T1 and a second transistor T2.

Inputs of the first transmission gate TG1 and the second transmission gate TG2 are connected to a plurality of word-lines WL, while the plurality of word-lines WL are activated, the first transmission gate TG1 and the second transmission gate TG2 are configured to be controlled according to the bit-line sensing signal SenseBL and the complementary bit-line sensing signal SenseBLB. When the plurality of bit-lines BL are determined to be sensed in the sensing operation, the first transmission gate TG1 receives the bit-line sensing signal SenseBL to be enabled, and the second transmission gate TG2 receives the bit-line sensing signal SenseBL to be disabled, while the second transistor T2 is triggered to pull the voltage of the second word-line WLR to the ground. On the contrary, when the plurality of complementary bit-lines BLB are determined to be sensed in the sensing operation, the first transmission gate TG1 receives the complementary bit-line sensing signal SenseBLB to be disabled, and the second transmission gate TG2 receives the complementary bit-line sensing signal SenseBL to be enable, while the first transistor T1 is triggered to pull the voltage of the first word-line WLL to the ground. Therefore, the plurality of first word-lines WLL may be correctly activated if the plurality of bit-lines BL are determined to be sensed in the sensing operation, and the plurality of second word-lines WLR may be correctly activated if the plurality of complementary bit-lines BLB is determined to be sensed in the sensing operation.

Figure 6:
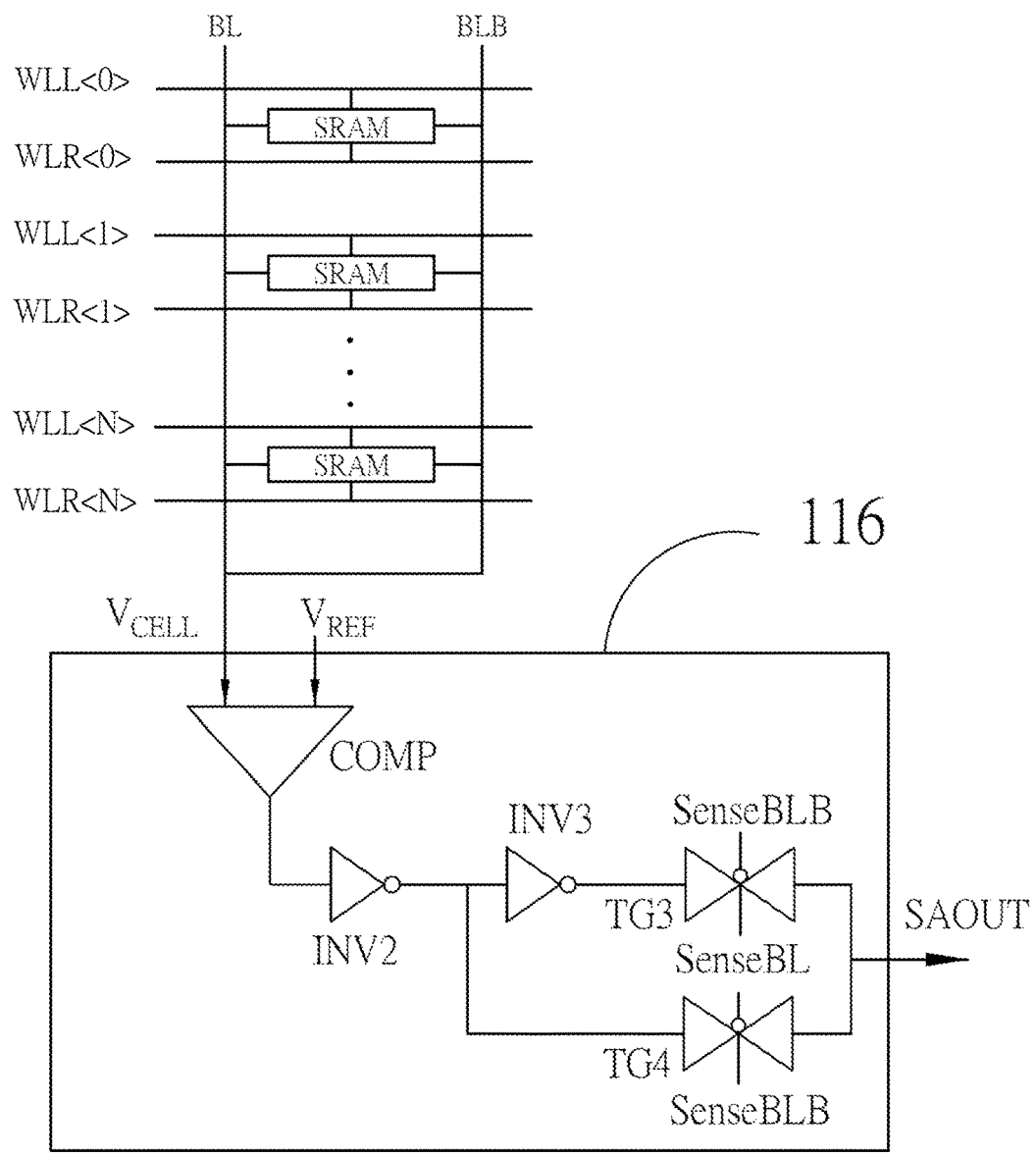
FIG. 6 is a circuit layout of the sensing output inversion circuit according to the embodiment of the present application.

Further referring to FIG. 6, which is a circuit layout of the sensing output inversion circuit according to the embodiment of the present application. The storage device 100 of the present application may further include a sensing output inversion circuit 116, which is connected to an output of the plurality of bit-lines BL and the plurality of complementary bit-lines BLB in each columns of the matrix. If the plurality of complementary bit-lines BLB are determined to be sensed in the sensing operation, the sensing output inversion circuit is configured to invert output signals of the plurality of complementary bit-lines BLB.

In the present embodiment, the sensing output inversion circuit 116 may include a comparator COMP, a second invertor INV2, a third invertor 3, a third transmission gate TG3 and a fourth transmission gate TG4. When the plurality of complementary bit-lines BLB are determined to be sensed in the sensing operation, the third transmission gate TG3 receives the complementary bit-line sensing signal SenseBLB to be disabled, and the fourth transmission gate TG2 receives the complementary bit-line sensing signal SenseBL to be enabled, such that the output sensing signal SAOUT may be an inverted signal of the outputs of the complementary bit-lines.

Figure 7A:
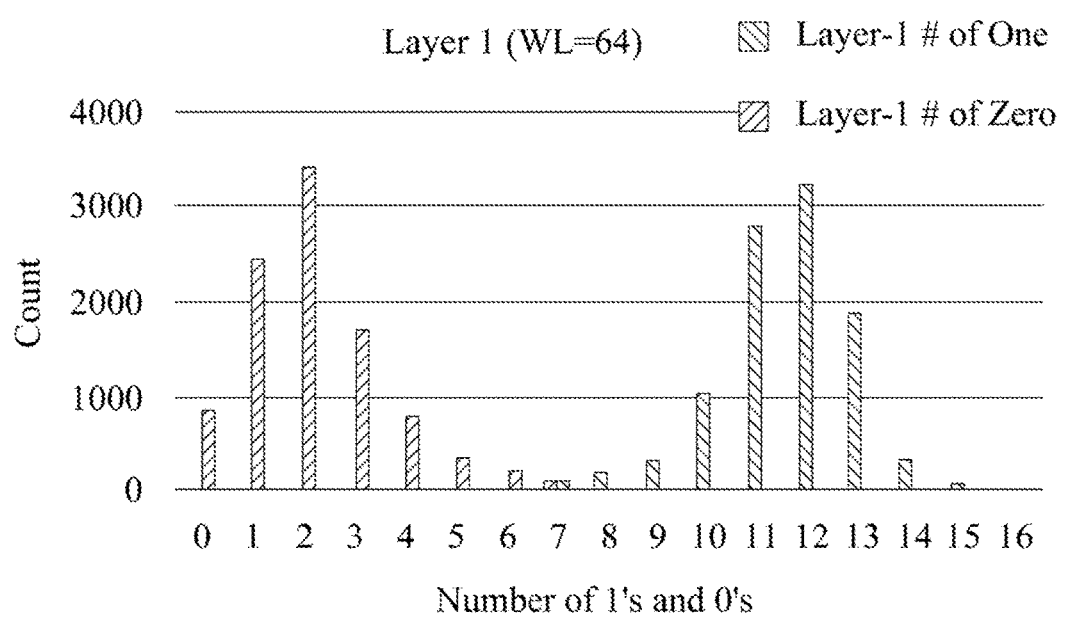
FIGS. 7A and 7B illustrate a diagram showing the simulated neuron weight 1's and 0's distributions for a 64×64×10 FCNN after back-propagation training.
Figure 7B:
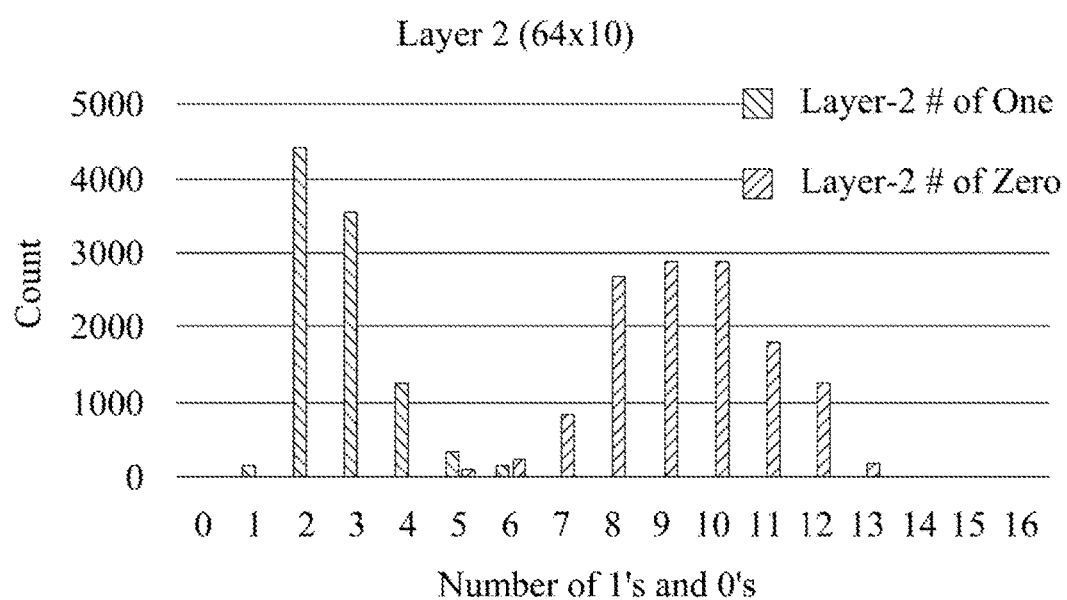
Figure 8:
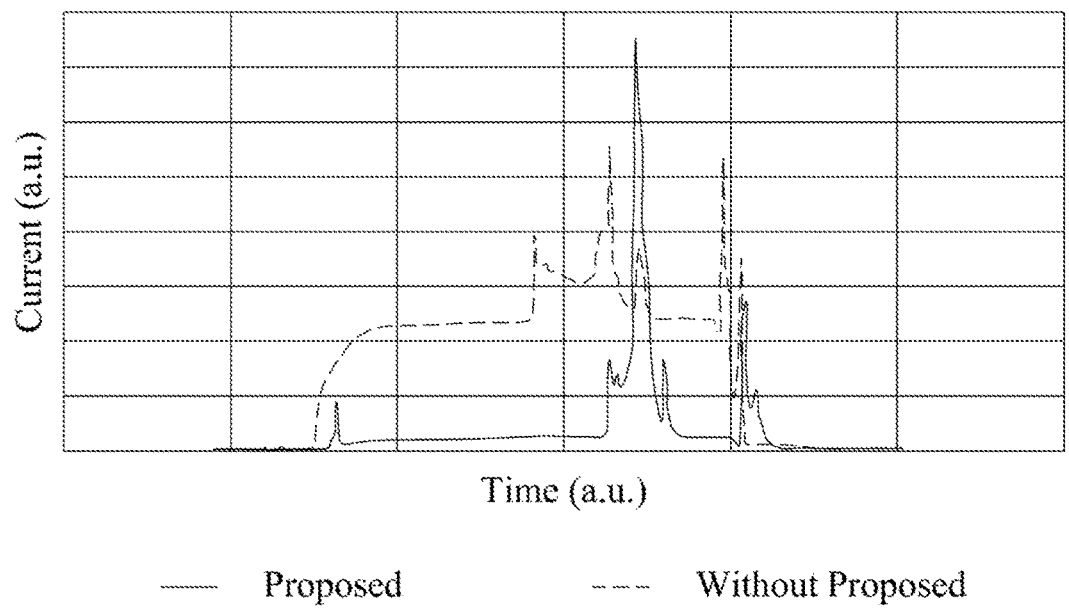
FIG. 8 illustrates a circuit simulation result for current consumption according to the embodiment of the present application.

Please refer to FIGS. 7A, 7B and 8, in which FIGS. 7A and 7B illustrate a diagram showing the simulated neuron weight 1's and 0's distributions for a 64×64×10 FCNN after back-propagation training in layer 1 and 2 respectively, and FIG. 8 illustrates a circuit simulation result for current consumption according to the embodiment of the present application. According to neural network back-propagation simulation with MNIST handwritten digit database in which 10,000 handwriting images are utilized as the test data, the accumulated number of activated neuron weight 1's and 0's (Activated*WEIGHT(SRAM 1' 0')) of the neuron network system is depicted in FIGS. 7A and 7B. The resulting neuron weight distribution for a three layer fully-connected neural network (FCNN) is asymmetrical. As can be seen in the figures, without the selective bit line sensing scheme, the electrical current is much greater since the bit lines with more neuron weight of 0's are sensed. To the contrary, the accumulated current is significantly reduced while utilizing the storage device according to the present application in which bit lines with more neuron weight of 1's are sensed.

Figure 9:
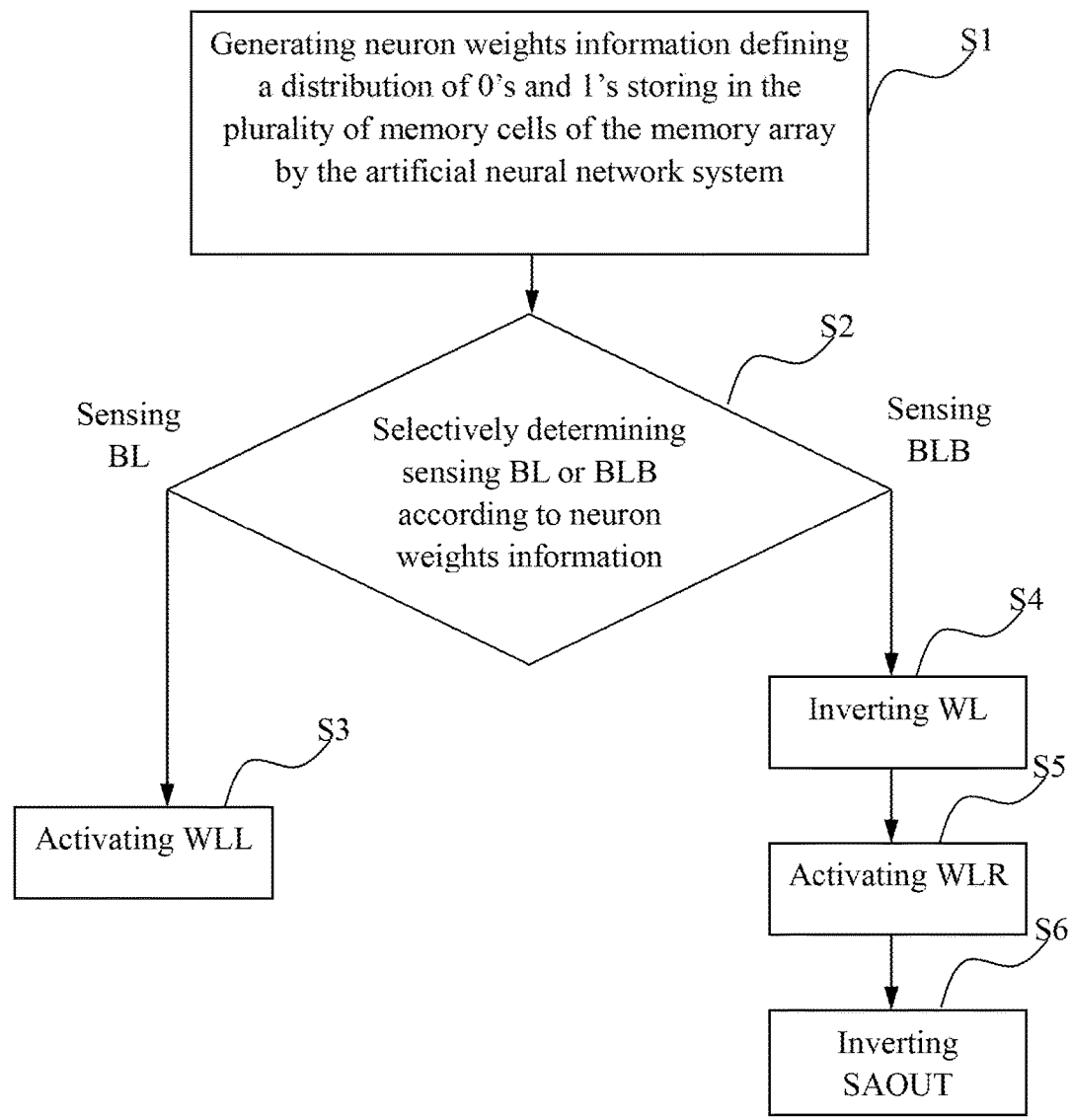
FIG. 9 is a flow chart showing the selective bit-line sensing method according to the embodiment of the present application.

The present application further provides a selective bit-line sensing method, the method is adapted for the artificial neural network system connecting to a storage device as described above. Please refer to FIG. 9, which is a flow chart showing the selective bit-line sensing method according to the embodiment of the present application. The method includes the steps of:

Step S1: generating neuron weights information, wherein the neuron weights information defines a distribution of 0's and 1's storing in the plurality of memory cells of the SRAM cell array by the artificial neural network system;

Step S2: selectively determining either the plurality of bit-lines or the plurality of complementary bit-lines to be sensed in a sensing operation according to the neuron weights information;

When the plurality of bit-lines are determined to be sensed in step S2, then entering step S3, activating the plurality of first word-lines by the artificial neural network system through the selective bit-line detection circuit.

When the plurality of complementary bit-lines are determined to be sensed in step S2, then entering step S4, inverting the word-line activating signal from the artificial neural network system to provide a complementary bit-line sensing signal by the mode selection circuit as depicted in the above descriptions, and then entering step S5.

Step S5: activating the plurality of second word-lines according to the complementary bit-line sensing signal, then entering step S6.

Step S6: inverting output signals of the plurality of complementary bit-lines by a sensing output inversion circuit.

From above, the selective bit-line sensing method and storage device utilizing the same of the present application provides an efficient way to provide a new SRAM memory architecture that may utilize the traditional memory cell design by offering two choose to sense through either BL or BLB according to external command or internal detector, while achieve energy-saving, time-saving and area-efficient characteristics.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope of all such changes and modifications as are within the true spirit and scope of the exemplary embodiment(s) of the present invention.

What is claimed is:

1. A selective bit-line sensing method adapted for an artificial neural network system connected to a storage device, with a memory array of the storage device comprising a plurality of memory cells arranged in a matrix and respectively connected to a plurality of first word-lines and a plurality of second word-lines, and columns of the matrix being respectively connected to a plurality of bit-lines and a plurality of complementary bit-lines, the method comprising the steps of:
   generating neuron weights information, the neuron weights information including weights of connections for the artificial neural network system, indicating the connections to the plurality of memory cells and providing the weights thereto, and defining a distribution of 0's and 1's storing in the plurality of memory cells of the memory array by the artificial neural network system; and
   selectively determining either the plurality of bit-lines or the plurality of complementary bit-lines to be sensed in a sensing operation according to the neuron weights information,
   wherein when the plurality of bit-lines are determined to be sensed in the sensing operation, the plurality of first word-lines are activated; and
   wherein when the plurality of complementary bit-lines are determined to be sensed in the sensing operation, the plurality of second word-lines are activated.

2. The method of claim 1, wherein the distribution of 0's and 1's further comprising a number of status Q=0 and a number of status QB=0 stored in the plurality of the memory cells.

3. The method of claim 2, wherein when the number of status Q=0 is smaller than the number of status QB=0, the plurality of bit-lines are determined to be sensed, and wherein when the number of status QB=0 is smaller than the number of status Q=0, the plurality of complementary bit-lines are determined to be sensed.

4. The method of claim 1, further comprising:
   configuring a mode selection circuit to provide a bit-line sensing signal when the plurality of bit-lines are determined to be sensed, and configuring the mode selection circuit to provide a complementary bit-line sensing signal when the plurality of bit-lines are determined to be sensed.

5. The method of claim 1, wherein if the plurality of complementary bit-lines are determined to be sensed in the sensing operation, signals of the plurality of first and second word-lines are inverted by a word-line activation circuit.

6. The method of claim 1, wherein if the plurality of complementary bit-lines are determined to be sensed in the sensing operation, output signals of the plurality of complementary bit-lines are inverted by a sensing output inversion circuit.

7. A storage device adapted for an artificial neural network system, the artificial neural network system being configured to generate neuron weights information including weights of connections for the artificial neural network system, indicating the connections to memory cells and providing the weights thereto, and defining a distribution of 0's and 1's, and the artificial neural network system further being configured to determine a number of word-lines to be activated, the storage device comprising:
   a memory array, comprising:
      a plurality of memory cells arranged in a matrix and storing 0's and 1's according to the neuron weights information;
      a plurality of first word-lines connected to the plurality of memory cells, respectively;
      a plurality of second word-lines connected to the plurality of memory cells, respectively;
      a plurality of bit-lines connected to columns of the matrix, respectively; and
      a plurality of complementary bit-lines connected to the columns of the matrix, respectively;
   an array control circuit coupled to the memory array; and
   a selective bit-line sensing control circuit coupled to the array control circuit, configured to control the array control circuit to selectively sense either the plurality of bit-lines or the plurality of complementary bit-lines in a sensing operation;
   wherein sensing of the plurality of bit-lines or the plurality of complementary bit-lines is determined according to the neuron weights information;
   wherein when the plurality of bit-lines are determined to be sensed in the sensing operation, the plurality of first word-lines are activated; and
   wherein when the plurality of complementary bit-lines are determined to be sensed in the sensing operation, the plurality of second word-lines are activated.

8. The storage device of claim 7, wherein the distribution of 0's and 1's further comprising a number of status Q=0 and a number of status QB=0 stored in the plurality of the memory cells.

9. The storage device of claim 8, wherein when the number of status Q=0 is smaller than the number of status QB=0, the plurality of bit-lines are determined to be sensed, and
   wherein when the number of status QB=0 is smaller than the number of status Q=0, the plurality of complementary bit-lines are determined to be sensed.

10. The storage device of claim 7, further comprising a selective bit-line sensing detection circuit coupling to the selective bit-line sensing control circuit, the elective bit-line sensing detection circuit being configured to determine either the plurality of bit-lines or the plurality of complementary bit-lines are to be sensed in the sensing operation according to the neuron weights information.

11. The storage device of claim 10, further comprising a mode selection circuit connected between the selective bit-line detection circuit and the plurality of the first and second word-lines, the mode selection circuit is configured to provide a bit-line sensing signal when the plurality of bit-lines is determined by the selective bit-line detection circuit to be sensed, and to provide a complementary bit-line sensing signal when the plurality of complementary bit-lines is determined by the selective bit-line detection circuit to be sensed.

12. The storage device of claim 7, further comprising a word-line activation circuit connected to the plurality of first and second word-lines, wherein the word-line activation circuit is configured to activate the plurality of first word-lines when the plurality of bit-lines are determined to be sensed in the sensing operation; and wherein the word-line activation circuit is configured to activate the plurality of second word-lines when the plurality of complementary bit-lines are determined to be sensed in the sensing operation.

13. The storage device of claim 7, further comprising a sensing output inversion circuit connected to an output of the plurality of bit-lines and the plurality of complementary bit-lines in each columns of the matrix, wherein the sensing output inversion circuit is configured to invert output signals of the plurality of complementary bit-lines when the plurality of complementary bit-lines are determined to be sensed in the sensing operation.

* * * * *